United States Patent [19]
Kadono et al.

[11] Patent Number: 5,500,539
[45] Date of Patent: Mar. 19, 1996

[54] METHOD OF DEPOSITING DIAMOND AND DIAMOND LIGHT EMITTING DEVICE

[75] Inventors: Masaya Kadono, Atsugi; Shunpei Yamazaki, Tokyo, both of Japan

[73] Assignee: Semiconductor Energy Laboratory Co., Ltd., Kanagawa, Japan

[21] Appl. No.: 322,379

[22] Filed: Oct. 13, 1994

Related U.S. Application Data

[60] Continuation of Ser. No. 751,954, Aug. 29, 1991, abandoned, which is a division of Ser. No. 523,408, May 15, 1990, Pat. No. 5,106,452.

[30] Foreign Application Priority Data

| Jun. 5, 1989 | [JP] | Japan | 1-143554 |
| Jun. 5, 1989 | [JP] | Japan | 1-143555 |
| Jun. 12, 1989 | [JP] | Japan | 1-149177 |

[51] Int. Cl.⁶ ............................................. H01L 31/0312
[52] U.S. Cl. ......................... 257/77; 257/17; 257/34; 257/12; 257/131; 257/102; 257/590
[58] Field of Search ....................... 357/17, 61, 34, 357/12, 131, 110.2, 590; 257/77

[56] References Cited

U.S. PATENT DOCUMENTS

| 4,571,447 | 2/1986 | Prins | 257/77 |
| 5,002,899 | 3/1991 | Geis et al. | 257/77 |
| 5,006,914 | 4/1991 | Beetz | 357/61 |
| 5,051,785 | 9/1991 | Beetz | 357/34 |
| 5,132,749 | 7/1992 | Nishibayashi et al. | 357/61 |

*Primary Examiner*—Edward Wojciechowicz
*Attorney, Agent, or Firm*—Sixbey, Friedman, Leedom & Ferguson; Gerald J. Ferguson, Jr.; Jeffrey L. Costellia

[57] ABSTRACT

A method of depositing high quality diamond films and a light emitting device are described. The deposition is carried out in a reaction chamber. After disposing a substrate to be coated in the chamber, a carbon compound gas including a C—OH bond is introduced together with hydrogen thereinto. Then, deposition of diamond takes place in a magnetic field by inputting microwave energy. The present invention is particularly characterized in that the volume ratio of the carbon compound to hydrogen introduced into the reaction chamber is 0.4 to 2; the pressure in said reaction chamber is 0.01 to 3 Torr; the temperature of the substrate is kept between 200° to 1000° C. during deposition; and the input energy of the microwave is no lower than 2 KW. By this method, uniform and high quality diamond films can be formed.

12 Claims, 5 Drawing Sheets

F I G. 5
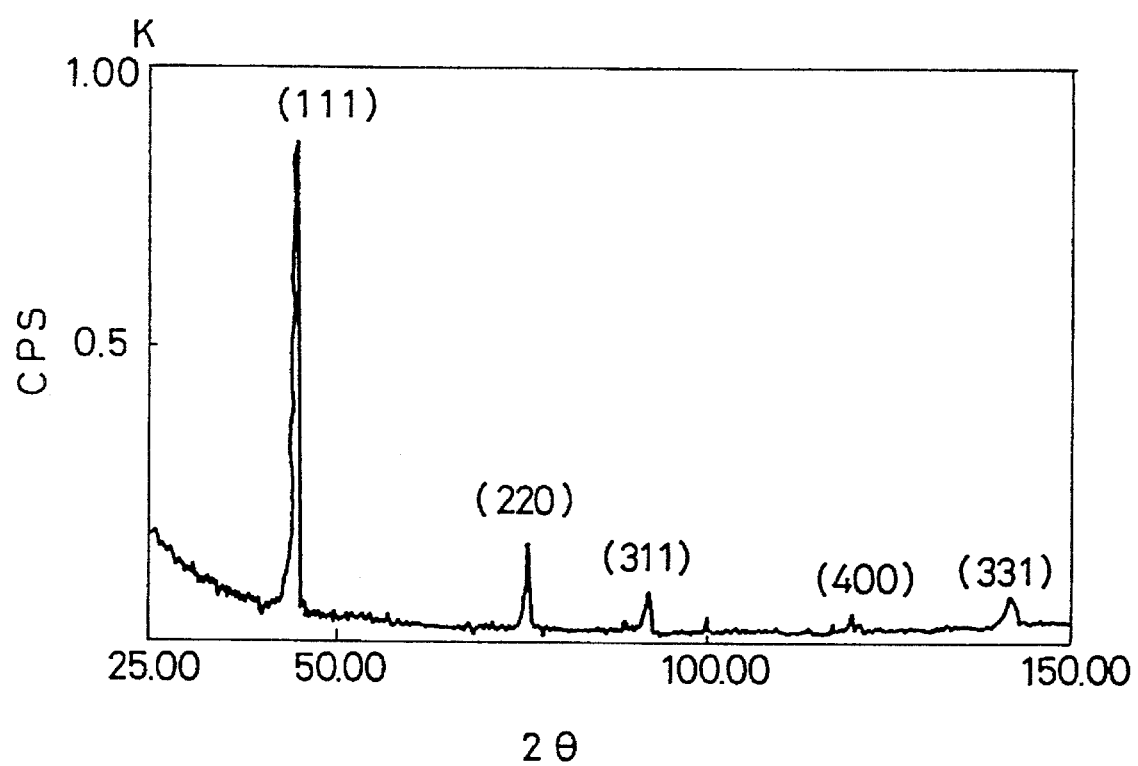

METHOD OF DEPOSITING DIAMOND AND DIAMOND LIGHT EMITTING DEVICE

This application is a continuation of Ser. No. 07/751,954, filed Aug. 29, 1991, now abandoned; which itself is a divisional application of Ser. No. 07/523,408, filed May 15, 1990, now U.S. Pat. No. 5,106,452.

BACKGROUND OF THE INVENTION

1. Field of the Invention

The present invention relates to a method of depositing diamond films having uniform thickness by means of microwave enhanced CVD and a light emitting device formed by this method.

2. Description of the Prior Art

Many attempts have been proposed to deposit diamond films by microwave assisted CVD, since diamond is regarded promising as a future material for electronic devices. Particularly, diamond light emitting devices have attracted interest of many researchers, because of its high thermal resistance, cheminally stabilies and low price suitable for mass production, in view of a great demand for light emitting devices in the market. An example of such devices is described in Japanese Patent Application No.sho56-146930. It is, however, very difficult to deposit high quality diamond films having uniform thicknesses at high deposition speeds required for production on a commercial base.

The deposition conditions of prior art diamond formation have been such that; the reactive gas is composed of a hydrocarbon diluted by hydrogen at about 1–5%; the pressure of the reactive has during deposition is about 5–20 Torr; the input power of microwaves if 1–5 KW; and the deposition is carried out in a magnetic field of 2 KG. Crystal surfaced can be observed by a microscope even in the surface of diamond films deposited by such a prior art method. The deposition speed achieved by these deposition methods, however, have been limited up to 667 angstrom thickness per hour, i.e. it takes 15 hours to deposit a one micrometer thick diamond film. Furthermore, the area coated by diamond is limited only to 3 cm ∅ keeping the disparity in thickness within 10%. Still further, the quality of diamond deposited is not so high. Graphite is also deposited and gets mixed into diamond films. The graphite component has been confirmed by Raman spectroscopic analysis.

It is also known to use carbon monooxide diluted by hydrogen at 1–5%. The pressure in a reaction chamber in this case is 0.1–1 Torr. The deposition speed, however, is also low. It takes more then 10 hours to deposit a diamond film of one micrometer thickness even when input energy is applied at 3–5 KW. The deposited area within which a uniform diamond film can be deposited is only up to 5 cm square. The more problematic disadvantage of this method is etching of inner walls of the chamber. The etching causes metallic contamination in diamond films deposited. The metal is such as Fe constituting the wall. This contamination was confirmed by Auger electron spectroscopy. The etching product is coated also on a window through which microwaves are admitted to the chamber and form an impediment of the microwave introduction.

BRIEF SUMMARY OF THE INVENTION

It is an object of the present invention to provide a method of depositing diamond of high quality at a high speed.

It is another object of the present invention to provide a diamond light emitting device having excellent emission performance.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, microwave-assisted chemical vapor reaction is carried out using a carbon compound gas which includes a C—OH bond. The carbon compound is introduced into a deposition chamber together with hydrogen at a volume ratio of the carbon compound gas/hydrogen= 0.4 to 2.0. The deposition takes place in a magnetic field when microwaves energy is inputted to the reactive gas at no lower than 2 KW. The pressure of the reactive gas is kept between 0.01 to 3 Torr during the deposition. The substrate temperature is kept between 200° to 1000° C..

The most effective flow speed of the reactive gas passing through the deposition space is 30 to 600 cm/sec preferably 35 to 200 cm/sec. The features of the present invention include the relatively high flow speed, the relatively low pressure and the relatively high proportion of the carbon compound gas to hydrogen as compared with conventional methods. By this method, diamond films consisting of $sp^3$ bonds can be deposited within 10% disparity in thickness at no lower than 0.5 micrometer/hour, typically at no lower than 1 micrometer/hour.

In accordance with the present invention, oxygen atoms are automatically introduced into the diamond films. The oxygen atoms function as recombination centers and when applied for a light emitting device the emission efficiency is improved. The density of oxygen in the deposited diamond is for example $1 \times 10^{18}$ to $6 \times 10^{20}$ $cm^{-1}$. The diamond films can be doped with impurities such as P or B in order to make impurity semiconductor films of n- or p- types. For n-type semiconductors, a dopant of VI Group can be also used. The VI Group element makes the semiconductors to be of n-type by causing lattice defects rather than by functioning as a donor.

It is very important for the present invention to use a carbon compound gas having a C—OH bond. When CO or $CO_2$ is used together with such as $CH_4$ as conventional methods, diamond films containing oxygen atoms can be deposited. The films are, however, necessarily contaminated by iron ions which are brought from etching action of the inner wall of the reaction chamber. In this conventional case, oxygen ions are produced as lone atoms which excert strong etching action upon the wall. The inventor assumes that in case of the present invention OH or $H_2O$ radicals are produced instead of lone 0 atoms. The etching effect of such OH or $H_2O$ radicals is not so strong to remove iron from the inner wall but sufficient to remove graphite from the deposted diamond.

BRIEF DESCRIPTION OF THE DRAWINGS

The accompanying drawings, which are incorporated in and form a part of the invention and, together with the description, serve to explain the principles of the invention.

FIG. 5 is a graphic diagram showing XRD spectra of a diamond film deposited in accordance with the present invention.

DETAILED DESCRIPTION OF THE PREFERRED EMBODIMENTS

Figure 1:
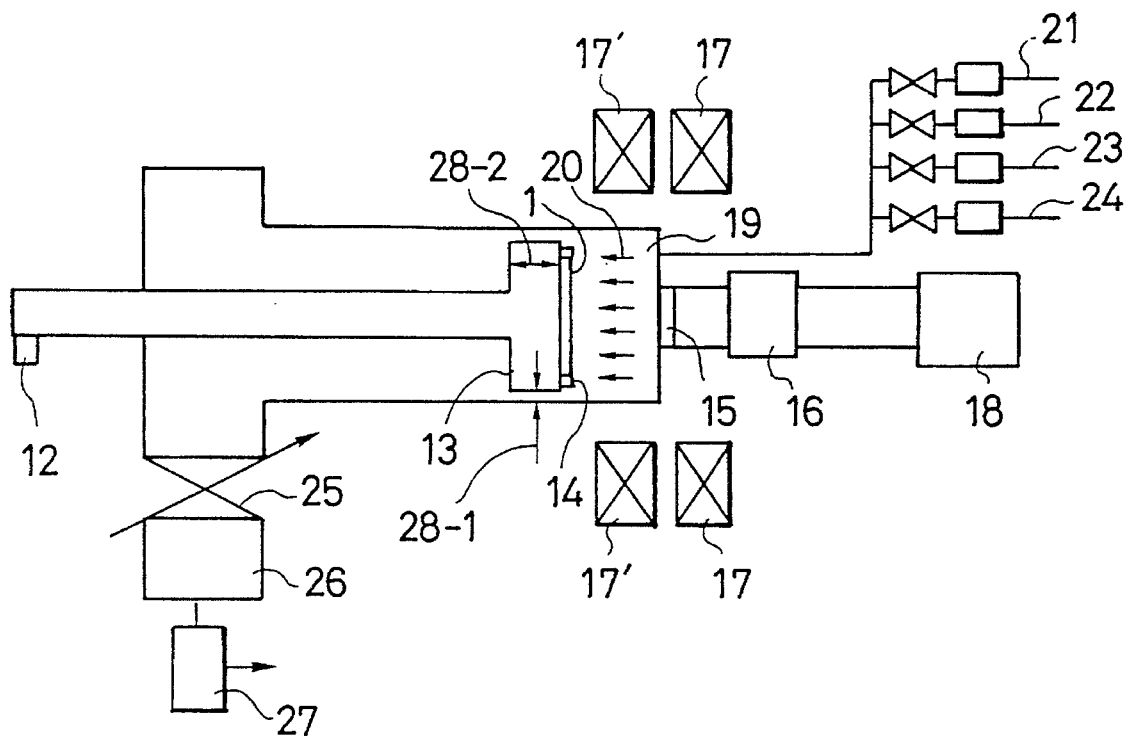
FIG. 1 is a cross sectional view of a chemical vapor reaction apparatus for depositing diamond in accordance with the present invention.

Referring now to FIG. 1, a microwave-assisted CVD apparatus provided with associated Helmholtz coils 17 and 17' for use in depositing diamond films in accordance with the present invention is shown. The apparatus comprises a vacuum chamber defining a reaction (deposition) space 19 therein, a microwave generator 18 connected to the chamber through an attenuater 16 and a quartz window 15, a gas introduction system having four inlet ports 21 to 24, a gas evacuation system having a wide-range turbo molecular pump 26 and a rotary pump 27 for roughing coupled with the chamber through a pressure controlling valve 25 and a substrate holder 13 provided in the chamber and with a substrate position adjusting mechanism 12 for supporting a substrate 1 at an appropriate position. By the use of the adjusting mechanism 12, the axial position of the holder can be adjusted in order to change the volume of the reactive spece 19. The evacuation system funtions both as a pressure controller and as a stop valve. The pressure in the chamber is adjusted by means of the valve 25. The inside of the chamber and the holder 13 are circular and coaxial with each other. The diameter of the circular inside of the chamber is 170 mm. The diameter 28-1 of the circular holder 13 is chosen to be 140 mm so that the clearance between the chamber wall and the holder 13 is about 15 mm. The thickness 28-2 of the holder 1 is 10 to 50 mm. The clearance may be determined between 3 and 30 mm in general. By this configuration, the reaction space 19 is confined in order not to substantially loose input energy and the reflection of microwaves inputted is only about 5%.

Next, a method of depositing diamond films by means of the apparatus will be described in accordance with the invention. The substrate is, for example, a single crystalline silicon semiconductor wafer of 2 to 6 inches, e.g. 4 inches diameter. The surface of the substrate is preferably given scrachs which form focuses for crystalline growth. The scrachs are formed for example by putting the substrate in a liquid in which diamond fine particles are dispersed and applying ultrasonic waves thereto for 1 minute to 1 hour, or by bombarding the surface with diamond powders. After fixing the substrate 1 on the holder 13 with a keeper 14, the pressure in the reaction space 19 is reduced to $10^{-4}$ to $10^{-17}$ Torr by means of the evacuation system followed by introduction of a reactive gas to a pressure of 0.01 to 3 Torr, typically 0.1 to 1 Torr, e.g. 0.26 Torr. The reactive gas comprises an alcohol such as methyl alcohol ($CH_3OH$) or ethyl alcohol ($C_2H_5OH$) diluted with hydrogen at a volume ratio of alcohol/hydrogen=0.4 to 2. The hydrogen is introduced through the port 21 at 100 SCCM and the alcohol through the port 22 at 70 SCCM for example. The coils are energized during the deposition to induce a magnetic field having a maximun strength of 2 K Gauss and a resonating strength of 875 Gauss at the surface of the substrate 1 to be coated. Then, microwaves are applied at 1 to 5 GHz, e.g. 2.45 GHz in the direction parallel to the direction of the magnetic field to cause ionized particles of the reactive gas in the form of plasma to resonate therewith in the magnetic field. As a result, a polycrystalline film of diamond grows on the substrate. 2 hour deposition for example can form a diamond film of 0.5 to 5 micrometer thickness, e.g. 1.3 micrometers thickness. During the deposition of diamond film, carbon graphite is also deposited. However, the graphite, which is relatively chemically unstable as compared with diamond, reacts with radicals which also occur in the plasma of the alcohol and is removed from the deposited film. The temperature of the substrate 1 is elevated to 200° C. to 1000° C., typically 300° C. to 900° C., e.g. 800° C. by microwaves. If the substrate temperature is too elevated, water cooling is effected to the substrate holder 13.

The flow speed of the reactive gas 20 in the reaction space 19 is regulated by controlling the valve 25. By virtue of the molecular pump 26, the speed can be adjusted from 15 cm/sec up to 1000 cm/sec even at 0.01 Torr in the reaction spece 19. From the view point of the deposition performance, speeds of 30 to 600 cm/sec typically 35 to 200 cm/sec are appropriate.

Figure 2:
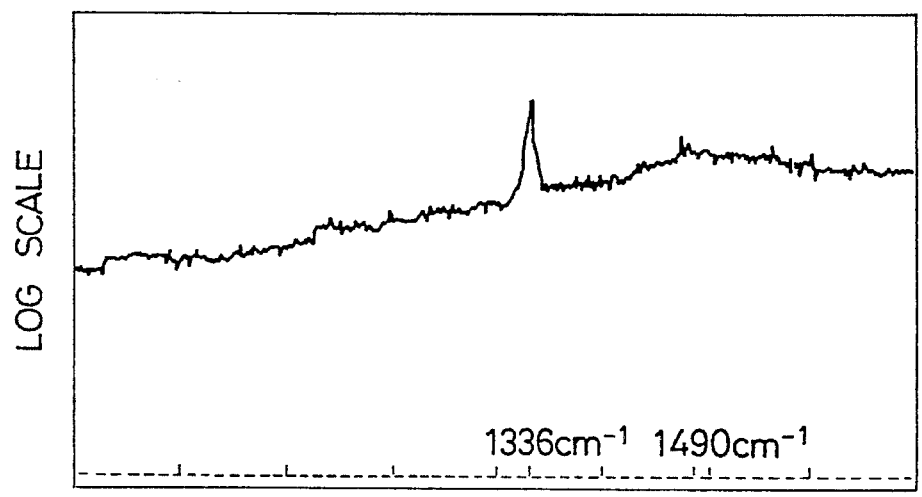
FIG. 2 is a graphic diagram showing a result of Raman spectroscopic analysis of a diamond film deposited in accordance with the present invention.

In accordance with experiments, crystalline surfaces of single carbon crystals were clearly observed partially in the films even deposited at a substrate temperature of 200° C. When deposited at a substrate temperature of 300° C., single crystalline surfaces were obserbed throughout the films deposited. FIG. 2 is a diagram showing Raman spectroscopic analysis of a diamond film deposited in accordance with the present invention. The sharp peak appearing at 1336 $cm^{-1}$ indicates existence of diamond. There is hardly found a peak at 1490 $cm^{-1}$ indicative of existence of graphite. It has been confirmed by Auger electron spectrometry that few iron or stainless contamination occurs in deposited films. It has also been confirmed by secondary ion mass spectroscopy that the .diamond films include oxygen atoms at $1 \times 10^{18}$ to $6 \times 10^{20}$ $cm^{-3}$. The oxygen concentration depended upon the pressure of the reactive gas and the input energy of microwaves during deposition.

Depending upon the purposes, some impurities may be introduced into diamond films during deposition. Examples of such impurities include B, S, Se and Te. In case of B, $B(CH_3)_3$ may be introduced as a dopant together with the reactive gas at a volume ratio of dopant gas/alcohol=0.005 to 0.03. In case of S, $H_2S$ or $(CH_3)_2S$ may be introduced as a dopant together with the reactive gas at a volume rate of dopant gas/alcohol=0.001 to 0.03. In the same manner, $H_2Se$, $H_2Te$, $(CH_3)_2Se$ and $(CH_3)_2Te$ can be used as dopant gases. Also, elements of Group IIb such as Zn and Cd can be introduced using a dopant gas of hydrogen or organic compound thereof, or elements of Group Vb can be introduced using $NH_3$, $PH_3$ or $AsH_3$ for example.

Figure 3:

The above deposition process was repeated at diverse reaction pressures and with reactive gases diluted with hydrogen at diverse ratios. The alcohol used was methanol. The input power of microwaves was 2 KW. The appearences of crystalline conditions of diamond films deposited were examined by a scanning electron microscope and evaluated into three ranks as shown on the most right column of Table 1 with correspondence to the volume ratio of $CH_3OH/H_2$, the substrate temperature and the pressure of the reactive gas ($CH_3OH/H_2$). In the table, mark ⊚ indicates that squares and/or triangles of crystal surfaces were observed throughout the diamond surface; mark ◊ indicates that the diamond surface was covered partially by crystal surfaces; and X indicates that no crystal surface was observed. FIG. 3 is a photograph showing the crystalline surface of No. 1 sample for reference.

TABLE 1

| No. | volume ratio of $CH_3OH/H_2$ | Temperature of substrate | Pressure of the gas | Condition of the film |
|---|---|---|---|---|
| 1 | 0.7 | 800° C. | 0.2 Torr | ⊚ |
| 2 | 0.8 | 600° C. | 0.1 Torr | ⊚ |
| 3 | 0.7 | 200° C. | 0.2 Torr | ◊ |
| 4 | 0.7 | 400° C. | 0.03 Torr | ◊ |
| 5 | 0.4 | 800° C. | 0.15 Torr | ⊚ |
| 6 | 0.4 | 800° C. | 3.0 Torr | ◊ |
| 7 | 2.0 | 800° C. | 0.27 Torr | ◊ |
| 8 | 0.6 | 800° C. | 5.0 Torr | X |
| 9 | 0.6 | 800° C. | 0.01 Torr | X |

TABLE 2

| No. | Pressure | H (1/min) | $CH_3/H_2$ (1/min) | Total (1/min) | F. Speed |
|---|---|---|---|---|---|
| 1 | 0.03 | 2533 | 1773 | 4266 | 313 |
| 2 | 0.1 | 760 | 532 | 1292 | 95 |
| 3 | 0.26 | 292 | 204 | 496 | 36.4 |
| 4 | 0.6 | 126 | 88.2 | 214 | 15.7 |
| 5 | 1.0 | 76 | 53.2 | 129 | 9.5 |
| 6 | 0.03 | 2533 | 2533 | 5066 | 372 |
| 7 | 0.1 | 760 | 760 | 1520 | 111.8 |
| 8 | 0.26 | 292 | 292 | 584 | 42.9 |
| 9 | 0.6 | 126 | 126 | 252 | 18.5 |
| 10 | 1.0 | 76 | 76 | 152 | 11.2 |
| 11 | 0.03 | 2533 | 5066 | 7599 | 558 |
| 12 | 0.1 | 760 | 1520 | 2280 | 167.6 |
| 13 | 0.26 | 292 | 584 | 876 | 64.4 |
| 14 | 0.6 | 126 | 252 | 378 | 27.4 |
| 15 | 1.0 | 76 | 152 | 228 | 16.8 |
| 16 | 0.03 | 2533 | 1266.5 | 3799.5 | 279 |
| 17 | 0.1 | 760 | 380 | 1140 | 83.8 |
| 18 | 0.26 | 292 | 146 | 438 | 32.2 |
| 19 | 0.6 | 126 | 63 | 189 | 13.9 |
| 20 | 1.0 | 76 | 38 | 114 | 8.4 |

Figure 4:
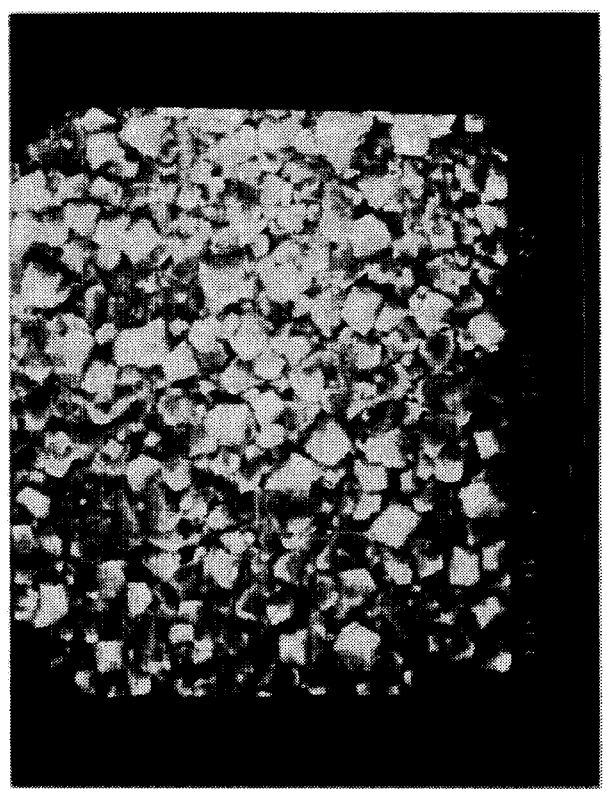
FIGS. 3 and 4 are photographs showing the surface conditions of diamond films deposited in accordance with the present invention.

Next, the deposition procedure was repeated with diverse flow speeds of the reactive gas through the reaction spece. The inner area of the reaction chamber was 2207 cm². The input energy of microwaves was 2 KW to 8 KW. The substrate temperature was 800° C.. Table 2 shows the pressures (Torr) in the reaction spece, the introduction rates (liter per minute) of hydrogen and methane, the total introduction rates thereof and the flow speeds (centimeter per second) of the reactive gas. Table 3 shows the deposition speeds (D.S.), the crystalline conditions (C.C.), the existence of graphite (E.G.) . The existence of graphite was confirmed by Raman spectroscopic analysis. In the cases of Nos. 1 to 5, hydrogen and methane were supplied under atmospheric pressure respectively at 100 SCCM and 70 SCCM (Nos. 1 to 5), at 100 SCCM and 100 SCCM (Nos. 6 to at 100 SCCM and 200 SCCM (Nos. 11 to 15) and at 100 SCCM and 50 SCCM (Nos. 16 to 20). The microscopic photograph of Sample No. 3 (4 KW) is shown in FIG. 4 for reference. The XRD (X-ray diffraction) spectra of Sample No. 3 is shown in FIG. 5. As seen from the spectra, count peaks appeared corresponding to crystalline planes of diamond.

TABLE 3

| No. | D.S. | C.C. | E.G. | D.S. | C.C. | G. |
|---|---|---|---|---|---|---|
| | (Input Energy = 2 KW) | | | (Input Energy = 4 KW) | | |
| 1 | <0.1 | — | — | 0.25 | ⊚ | no |
| 2 | 0.93 | ⊚ | no | 0.45 | ⊚ | no |
| 3 | 0.4 | ⊚ | no | 0.65 | ⊚ | no |
| 4 | 0.48 | ◊ | no | 0.85 | ◊ | no |
| 5 | 0.65 | X | yes | — | X | yes |
| | (Input Energy = 2 KW) | | | (Input Energy = 4 KW) | | |
| 6 | 0.8 | ⊚ | no | 1.5 | ⊚ | no |
| 7 | 1.0 | ⊚ | no | 1.7 | ⊚ | no |
| 8 | 1.7 | ⊚ | no | 2.3 | ◊ | no |
| 9 | — | ◊ | yes | — | X | yes |
| 10 | | | | | | |
| | (Input Energy = 2 KW) | | | (Input Energy = 4 KW) | | |
| 11 | 1.9 | ⊚ | no | 2.5 | ⊚ | no |
| 12 | 2.7 | ⊚ | no | 3.2 | ⊚ | no |
| 13 | 3.5 | ◊ | no | 4.5 | ◊ | no |
| 14 | — | ◊ | yes | 5.3 | X | yes |
| 15 | | | | | X | |
| | (Input Energy = 2 KW) | | | (Input Energy = 4 KW) | | |
| 16 | <0.1 | — | — | 0.15 | ⊚ | no |
| 17 | 0.2 | ⊚ | no | 0.3 | ⊚ | no |
| 18 | 0.35 | ⊚ | no | 0.5 | ⊚ | no |
| 19 | 0.58 | ◊ | no | 0.7 | ◊ | yes |
| 20 | 0.9 | ◊ | no | 0.95 | X | yes |

Figure 6A:
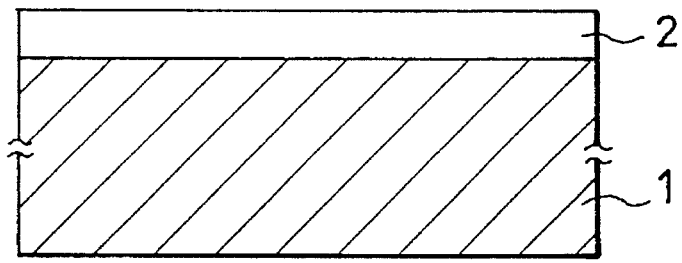
FIGS. 6(A) to 6(C) are cross sectional views showing a method of manufacturing diamond light emitting devices in accordance with the present invention.
Figure 6B:
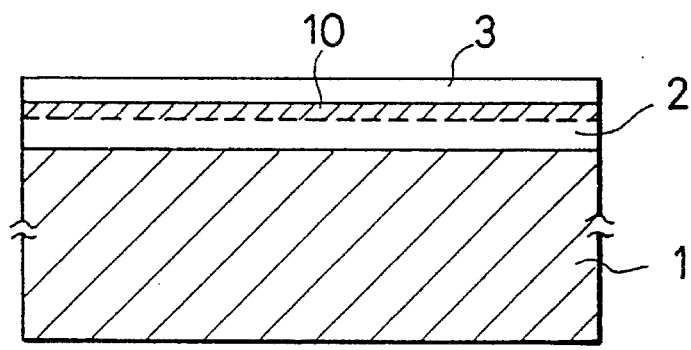
Figure 6C:
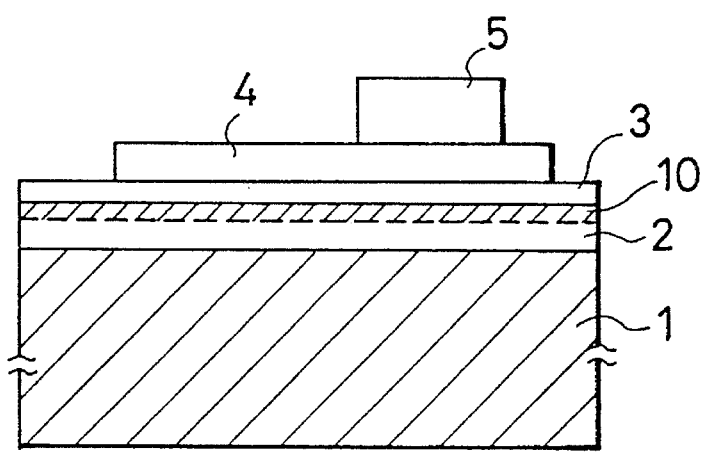

Referring now to FIG. 6, a method of forming a light emitting device utilizing the present invention will be explained. A diamond coating 2 is deposited on a p-type silicon semiconductor substrate 1 of a 4-inch wafer to a thickness of 0.5 to 3.0 micrometers, e.g. 1.3 micrometers, by the microwave-assisted plasma CVD method in a magnetic field as described above. During the deposition, $B(CH_3)_3$ is introduced as dopant gas together with $CH_3OH$ diluted by hydrogen at a volume ratio of $CH_3OH/H_2$= 0.8. The volume ratio of $B(CH_3)_3/CH_3OH$ is 0.03. The oxygen concentration of the diamond fire is $1\times10^{18}$ to $6\times10^{20}$ cm$^{-3}$. The diamond film is then given scratchs 10 by bombarding its surface with diamond powders. The scratchs 10 form focuses for growing diamond crystals therefrom. On the scratched surface, diamond deposition is carried out again to form a second diamond film 3 with a thickness of 0.5 micrometer. The reactive gas in this depostion consists of $H_2$, $CH_3OH$ and $(CH_3)_2S$ introduced at volume ratios of $(CH_3)_2S/CH_3OH$= 0.03 and $CH_3OH/H_2$= 0.7. Then, an upper transparent electrode 4 made of indium tin oxide (ITO) and a lead electrode 5 are deposited by vapor evaporation or sputtering. The lead electrode 5 may be a multilayered metallic film consisting of, e.g. alminum, silver, chromium and/or molibdenum films. The upper electrode 4 is severed by laser scribing into a number of 0.6 mm×0.6 mm segments on each of which the lead electrode 5 of 0.15 mm diameter is formed. The width of the scribing lines is 100 micrometers. Accordingly, 5000 light emitting elements of 1 mm×1 mm are formed within the 4-inch wafer except for a margin of 4 mm.

By this structure, light emission can be realized by causing electrical current to pass through the the diamond crystals of the film. The current induces recombination of electron-hole pairs between mid-gap states (radiation centers), between the midgap states and a valence band, between a conduction band and the midgap states and between the conduction band and the valence band. Oxygen atoms automatically introduced function as radiation centers. The spectrum of light emitted from a diamond film is determined by differential energy levels between the midgap states, the bottom of the conduction band and the apex of the valence band. Depending upon the differential levels, it is possible to emit blue or green light or radiation having continuous spectrum of wavelengths over a relatively wide range such as white light.

When a voltage of 10 to 200V (e.g. 60V) was applied across the diamond film 5 of a diamond light emitting device formed in accordance with the above procedure by means of the upper electrode 4 and the substrate 1 functioning as a counterpart lower electrode, diamond emitted green visual light at 6 cd/m$^2$ by virtue of current passing therethrough. The voltage may be applied as a DC voltage or as a pulse train at no higher than 100 Hz of a duty ratio of 50%. When products capable of emitting light at no lower than 5 cd/m$^2$ were regarded as acceptable, the yield of no lower than 85% was obtained.

Figure 7:
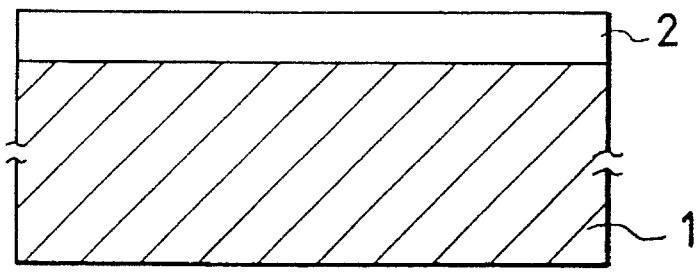
FIGS. 7(A) to 7(C) are cross sectional views showing a modification of the method of manufacturing a light emitting device illustrated in FIGS. 6(A) to 6(C).
Figure 7:
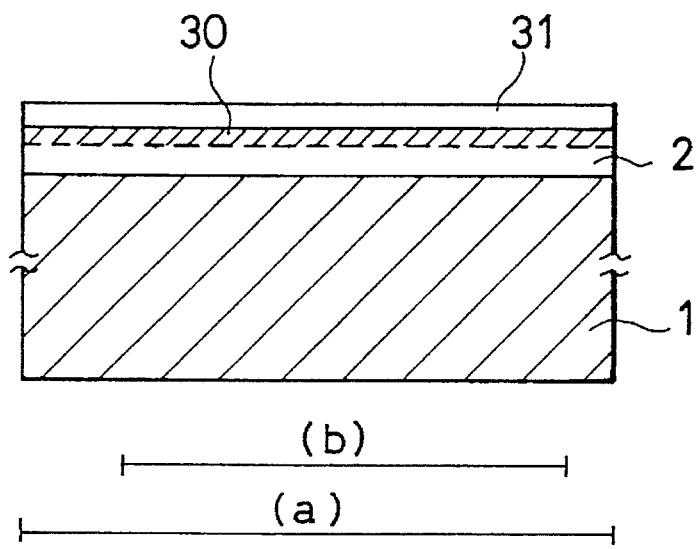
Figure 7:
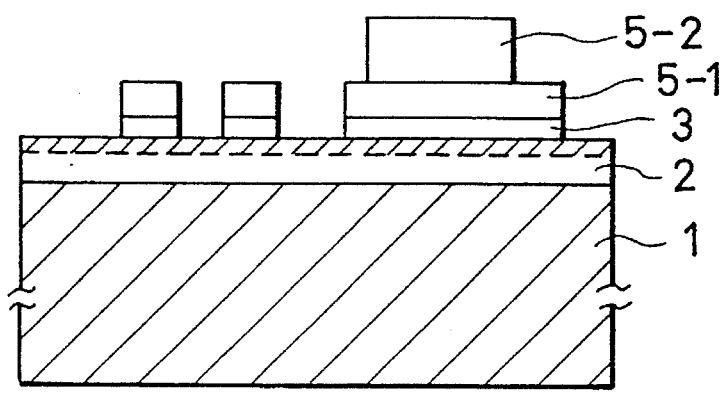

Referring now to FIG. 7, a modification of the example shown in FIG. 7 will be described. A boron-doped diamond coating 2 is deposited on a p-type silicon semiconductor substrate 1 of a 4-inch wafer to a thickness of 1.3 micrometers in the same manner as described above. An element of Group Vb is introduced to the surface of the diamond film 2 to form a doped surface 30 by ion implantation. On the doped surface 30, diamond deposition is carried out again to form a second diamond or silicon carbide film 31 of an n-type with a thickness of 0.5 micrometer. The reactive gas in this depostion consists of $H_2$, $CH_3OH$, $SiH_4$ and $PH_3$ introduced at volume ratios of $SiH_4/CH_3OH = PH_3/CH_3OH = 0.03$ and $CH_3OH/H_2 = 0.7$. An n-type silicon semiconductor film may be deposited in place of the silicon carbide film 31 by omitting the use of the alcohol. Then, an upper transparent electrode 5-1 made of a thin chromium film and a lead electrode 5-2 are deposited by vapor evaporation or sputtering. The lead electrode 5 may be a multilayered metallic film consisting of, e.g. alminum. The upper electrode 4 is sectioned into a number of 0.6 mm×0.6 mm effective regions (region (b) in the figure) by etching with a suitable mask of photoresist. Within each effective region, the upper electrode 4 is patterned to form a plurality of strips. At the same time, the second film 31 is etched with the same mask. The lead electrode 5 of 0.1 mm×0.1 mm is formed in each of effective region. Accordingly, nearly 10000 light emitting elements of 0.8 mm×0.8 mm (region (a) in the figure) are formed within the 4-inch wafer except for a margin of 4 mm. When a 40V was applied between the electrode 5-1 and the substrate 1, 20 cd/cm$^2$ light emission was obserbed.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. Although in the above examples alcohols are used as the reactive gas of carbon compound, other carbon compounds having a C—OH bond can be used. Examples include compounds having benzen rings such as $C_8(OH)_8$, $C_8H_3(OH)_3$, etc, or mixtures of compounds having a C—OH bond and another carbon compound having a C=C bond such as $C_2H_2$ mixed with $CH_3OH$. These carbon compounds are used by diluting with hydrogen. The deposition speed can be improved by a factor of 2 to 5 by the use of these alternatives. The cost of the reactive gas, however, becomes more expensive in these cases.

The present invention is broadly applicable to any electric device comprising a diamond film. These electric devices can be formed on a single substrate, i.e. an integrated circuit device which may consists of diamond light emitting devices, diamond diodes, diamond transistors, diamond resistances, diamond capacitors and the like. Of course, it is possible to severe a single substrate, after a number of diamond devices are formed on the substrate, into individual separate devices.

What is claimed is:

1. A diamond laminate body including a layer for an electronic device comprising:

a semiconductor substrate having a p-type conductivity for providing a first electrode arrangement;

a p-type diamond layer formed on said substrate;

a n-type semiconductor layer formed on said p-type diamond layer, said semiconductor comprising a material selected from the group consisting of diamond, silicon carbide and silicon; and a second electrode arrangement formed on said n-type semiconductor layer, wherein current passes through said p-type diamond layer and said n-type semiconductor layer when a voltage is applied across said first and second electrode arrangements.

2. The diamond electronic device of claim 1 wherein said device is a light emitting device.

3. The diamond electronic device of claim 1 wherein said p-type diamond is doped with boron.

4. The diamond electronic device of claim 1 wherein said second electrode arrangement includes a transparent electrode layer.

5. A laminate body including a diamond layer for an electronic device comprising:

a semiconductor substrate having a p-type conductivity for providing a first electrode arrangement;

a p-type diamond layer formed on said substrate, a surface of said layer doped with a group V element;

a n-type semiconductor layer formed on said p-type diamond layer, said semiconductor layer comprising a material selected from the group consisting of diamond, silicon carbide and silicon; and a second electrode arrangement formed on said n-type semiconductor layer, wherein current passes through said p-type diamond layer and said n-type semiconductor layer when a voltage is applied across said first and second electrode arrangements.

6. The diamond electronic device of claim 5 wherein said device is a light emitting device.

7. The diamond electronic device of claim 5 wherein said p-type diamond is doped with boron.

8. The diamond electronic device of claim 5 wherein said second electrode arrangement includes a transparent conductive layer.

9. The diamond electronic device of claim 8 wherein said second electrode arrangement further includes a metallic film formed on said transparent conductive film.

10. A laminate body including a diamond layer for an electronic device comprising:

a semiconductor substrate for providing a first electrode arrangement;

a diamond layer containing oxygen atoms formed on said substrate; and a second electrode arrangement formed on said diamond layer in order to permit an electric current flow through said diamond layer, wherein said oxygen atoms distributed throughout said diamond layer function as recombination centers.

11. The laminate body of claim 10 wherein the concentration of said oxygen atoms is $1 \times 10^{18}$ to $6 \times 10°$ atoms/cm$^3$.

12. The laminate body of claim 10 wherein said diamond layer is doped with an impurity selected from the group consisting of B, S, Se and Te.

* * * * *